United States Patent
Peng et al.

(10) Patent No.: US 11,075,269 B2
(45) Date of Patent: Jul. 27, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Yi Peng, Taipei (TW); Ting Tsai, Hsinchu (TW); Chung-Wei Hung, Tainan (TW); Jung-Ting Chen, Zhubei (TW); Ying-Hua Lai, Taipei (TW); Song-Bor Lee, Zhubei (TW); Bor-Zen Tien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/596,534

(22) Filed: Oct. 8, 2019

(65) Prior Publication Data

US 2020/0176566 A1 Jun. 4, 2020

Related U.S. Application Data

(60) Provisional application No. 62/774,150, filed on Nov. 30, 2018.

(51) Int. Cl.
| | |
|---|---|
| *H01L 29/08* | (2006.01) |
| *H01L 29/24* | (2006.01) |
| *H01L 29/78* | (2006.01) |
| *H01L 21/02* | (2006.01) |
| *H01L 21/265* | (2006.01) |

(52) U.S. Cl.
CPC .......... *H01L 29/0847* (2013.01); *H01L 29/24* (2013.01); *H01L 21/0262* (2013.01); *H01L 21/02521* (2013.01); *H01L 21/02529* (2013.01); *H01L 21/26513* (2013.01); *H01L 29/785* (2013.01); *H01L 29/7848* (2013.01)

(58) Field of Classification Search
CPC .................. H01L 29/785; H01L 29/7848
See application file for complete search history.

(56) References Cited

U.S. PATENT DOCUMENTS

| | | | |
|---|---|---|---|
| 2015/0255578 A1* | 9/2015 | Chang ................. | H01L 29/7848 257/343 |
| 2015/0372142 A1* | 12/2015 | Kuang ................. | H01L 29/165 257/192 |
| 2016/0056290 A1* | 2/2016 | Tsai ..................... | H01L 29/7833 257/192 |
| 2016/0141413 A1 | 5/2016 | Noh et al. | |
| 2016/0359021 A1* | 12/2016 | Kim .................... | H01L 29/0657 |
| 2017/0018645 A1 | 1/2017 | Maeda et al. | |

(Continued)

FOREIGN PATENT DOCUMENTS

KR 10-2016-0143945 A 12/2016

*Primary Examiner* — Julio J Maldonado
*Assistant Examiner* — Mohammad A Rahman
(74) *Attorney, Agent, or Firm* — McDermott Will & Emery LLP

(57) ABSTRACT

A semiconductor device, includes a channel region, and a source/drain region adjacent to the channel region. The source/drain region includes a first epitaxial layer, a second epitaxial layer epitaxially formed on the first epitaxial layer and a third epitaxial layer epitaxially formed on the second epitaxial layer, and the first epitaxial layer is made of SiAs.

20 Claims, 12 Drawing Sheets

(56) References Cited

U.S. PATENT DOCUMENTS

| | | | |
|---|---|---|---|
| 2017/0054023 A1* | 2/2017 | Li | H01L 21/3115 |
| 2017/0222050 A1* | 8/2017 | Chen | H01L 29/0847 |
| 2018/0069125 A1 | 3/2018 | Hong et al. | |
| 2018/0083109 A1 | 3/2018 | Yu et al. | |
| 2018/0158819 A1 | 6/2018 | Bae et al. | |
| 2018/0342583 A1 | 11/2018 | Yu et al. | |
| 2020/0020774 A1* | 1/2020 | Lee | B82Y 10/00 |
| 2020/0105754 A1* | 4/2020 | Murthy | H01L 29/785 |

* cited by examiner

SEMICONDUCTOR DEVICE AND MANUFACTURING METHOD THEREOF

RELATED APPLICATION

This application claims priority to U.S. Provisional Patent Application No. 62/774,150 filed Nov. 30, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon carbide (SiC), and/or silicon phosphide (SiP) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows one of the various stages of a sequential manufacturing operation of a semiconductor FET device according to an embodiment of the present disclosure.

FIGS. 2A, 2B, 2C and 2D show one of the various stages of a sequential manufacturing operation of a semiconductor FET device according to an embodiment of the present disclosure.

FIGS. 3A and 3B show one of the various stages of a sequential manufacturing operation of a semiconductor FET device according to an embodiment of the present disclosure.

FIGS. 4A and 4B show one of the various stages of a sequential manufacturing operation of a semiconductor FET device according to an embodiment of the present disclosure.

FIGS. 5A, 5B and 5C show one of the various stages of a sequential manufacturing operation of a semiconductor FET device according to an embodiment of the present disclosure.

FIG. 6 shows one of the various stages of a sequential manufacturing operation of a semiconductor FET device according to an embodiment of the present disclosure.

FIG. 7 shows one of the various stages of a sequential manufacturing operation of a semiconductor FET device according to an embodiment of the present disclosure.

FIG. 8 shows one of the various stages of a sequential manufacturing operation of a semiconductor FET device according to an embodiment of the present disclosure.

FIG. 9 shows one of the various stages of a sequential manufacturing operation of a semiconductor FET device according to an embodiment of the present disclosure.

FIG. 10 shows one of the various stages of a sequential manufacturing operation of is a semiconductor FET device according to an embodiment of the present disclosure.

FIGS. 11 and 12 show one of the various stages of a sequential manufacturing operation of is a semiconductor FET device according to another embodiment of the present disclosure.

FIGS. 13 and 14 show one of the various stages of a sequential manufacturing operation of is a semiconductor FET device according to another embodiment of the present disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In an n-type MOS FET, a SiP (Si with P) source/drain epitaxial layer is used. However, P from the SiP layer may be diffused into a channel region. Although it is possible to suppress the P diffusion by using a lower concentration P layer as an initial layer of the SiP layer, it may be insufficient to prevent the P diffusion.

In the present disclosure, elements having a larger mass and/or diffusion coefficient is used to prevent elements with a smaller mass and/or diffusion coefficient from out diffusion. IN some embodiments, an As containing layer is grown as the first epitaxial layer, to serve as a P diffusion barrier layer, which has a lower out-diffusion rate than a lightly P doped SiP layer into the channel region. The As containing layer is a SiAs epitaxial layer or an As implanted layer formed before a P containing epitaxial layer (e.g., SiP) is formed. Further, another As containing cap layer (e.g., SiAs layer) can also be formed on the SiP body to prevent the P out-gassing during contact metallization.

FIGS. 1-10 show views of various stages of a sequential manufacturing operation of a semiconductor device according to the present disclosure. It is understood that additional operations may be provided before, during, and after the processes shown by FIGS. 1-10, and some of the operations described below can be replaced or eliminated for additional embodiments of the method. The order of the operations/processes may be interchangeable.

Figure 1:
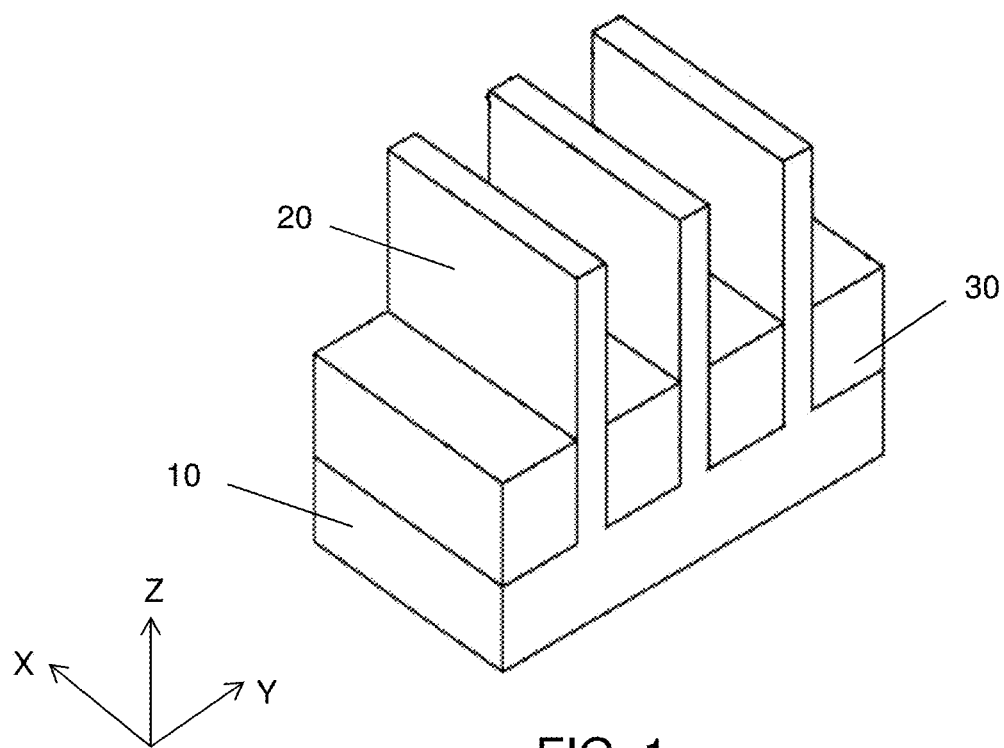

As shown in FIG. 1, one or more fin structures 20 are fabricated over a substrate 10. Further, an isolation insulating layer 30 (e.g., shallow trench isolation: STI) as shown in FIG. 1 is formed. The fin structure 20 includes a channel region 20A and a well region 20B (see FIGS. 2B and 2C).

The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including IV-IV compound semiconductors such as SiC and SiGe, III-v compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 1, three fin structures 20 extending in the X direction are disposed adjacent to each other in the Y direction. However, the number of the fin structures is not limited to three. The numbers may be one, two, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments. The space between the fin structures 20 is in a range of about 5 nm to about 80 nm in some embodiments, and may be in a range of about 7 nm to 15 nm in other embodiments. However, the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

After the fin structures 20 are formed, an isolation insulating layer 30 is formed over the fin structures 20.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of SOG, SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (e.g., the pad oxide layer and the silicon nitride mask layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 1.

In certain embodiments, the partial removing of the isolation insulating layer 30 may be performed using a wet etching process, for example, by dipping the substrate in hydrofluoric acid (HF). In another embodiment, the partial removing of the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 2A:
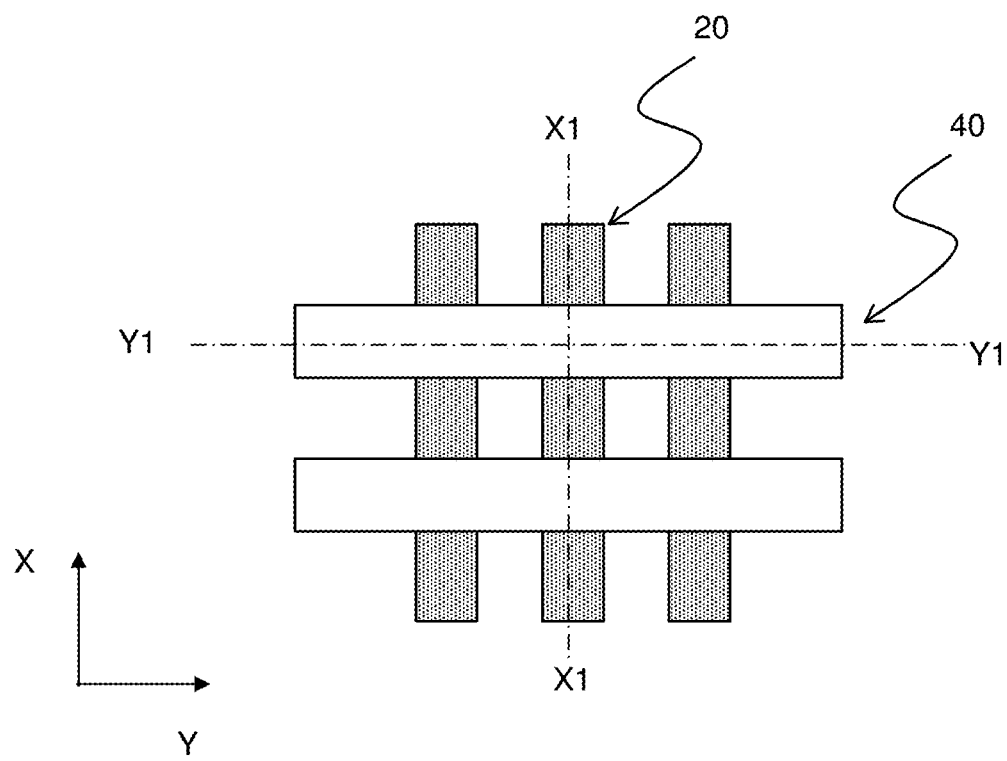
Figure 2B:
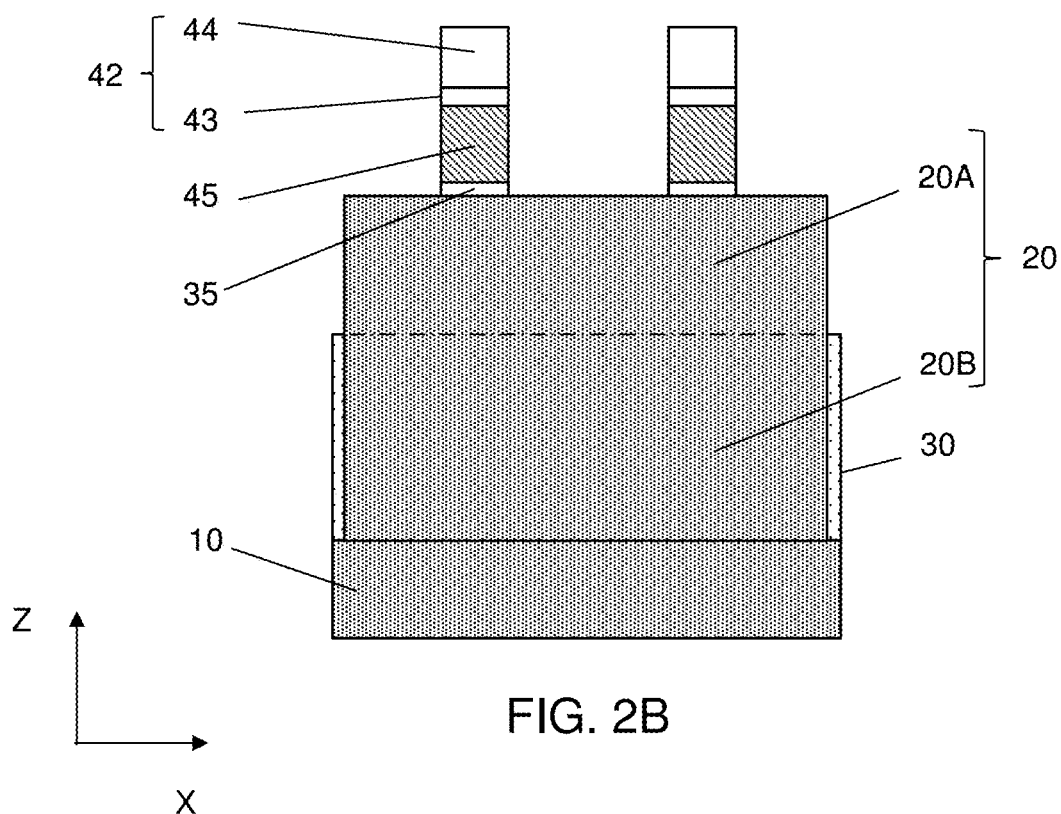
Figure 2C:
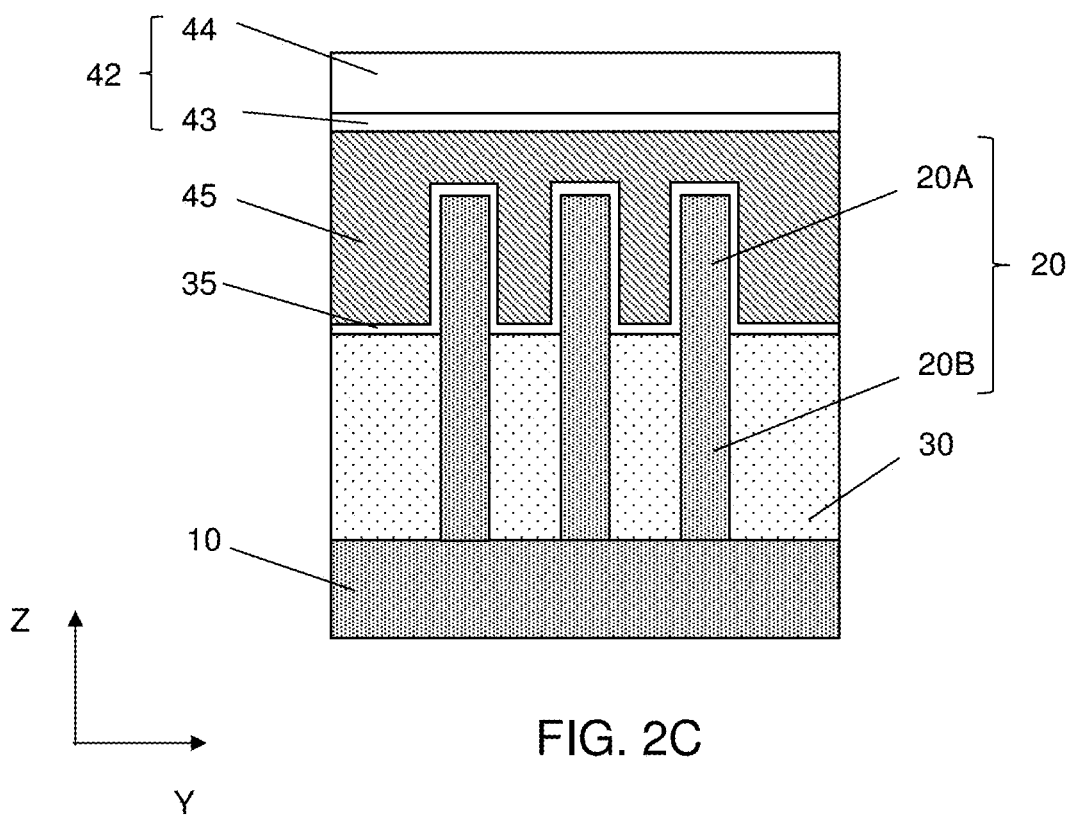
Figure 2D:
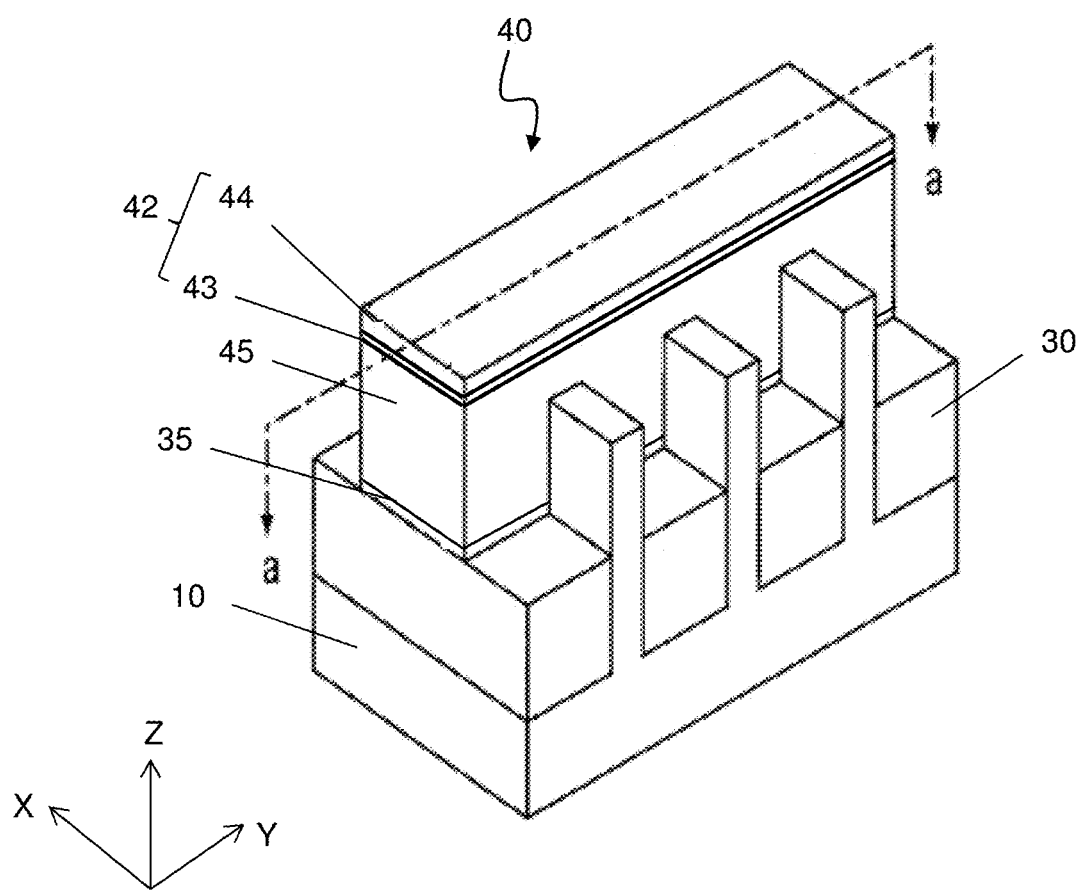

Then, a gate structure 40 is formed over part of the fin structures 20 as shown in FIGS. 2A-2D. FIG. 2A is a plan view (top view), FIG. 2B is a cross sectional view corresponding to X1-X1 of FIG. 2A, FIG. 2C is a cross sectional view corresponding to Y1-Y1 of FIG. 2A and FIG. 2D is an exemplary perspective view.

A gate dielectric layer and a poly silicon layer are formed over the isolation insulating layer 30 and the exposed fin structures 20, and then patterning operations are performed so as to obtain a gate structure including a gate electrode layer 45 made of poly silicon and a gate dielectric layer 35. The patterning of the poly silicon layer is performed by using a hard mask 42 including a silicon nitride layer 43 and an oxide layer 44 in some embodiments. In other embodiments, the layer 43 may be silicon oxide and the layer 44 may be silicon nitride. The gate dielectric layer 35 may be silicon oxide formed by CVD, PVD, ALD, e-beam evaporation, or other suitable process. In some embodiments, the gate dielectric layer 35 may include one or more layers of silicon oxide, silicon nitride, silicon oxy-nitride, or high-k dielectrics. In some embodiments, a thickness of the gate dielectric layer is in a range of about 1 nm to about 5 nm. In some embodiments, the gate dielectric layer 35 may include an interfacial layer made of silicon dioxide.

In some embodiments, the gate electrode layer 45 may comprise a single layer or multilayer structure. The gate electrode layer 45 may be doped poly-silicon with uniform or non-uniform doping. In the present embodiment, the width of the gate electrode layer 45 is in the range of about 30 nm to about 60 nm. In some embodiments, a thickness of the gate electrode layer is in a range of about 30 nm to about 50 nm.

As shown in FIG. 2A, two gate structures 40 extending in the Y direction are disposed adjacent to each other in the X direction. However, the number of the gate structures is not limited to two. The numbers may be one, three, four or five or more. In addition, one or more dummy gate structures may be disposed adjacent to both sides of the gate structures 40 to improve pattern fidelity in patterning processes. The width of the gate structure 40 is in a range of about 5 nm to about 40 nm in some embodiments, and may be in a range of about 7 nm to about 15 nm in certain embodiments. In some embodiments, the gate structures 40 are sacrificial gate structures in a gate replacement technology.

Figure 3A:
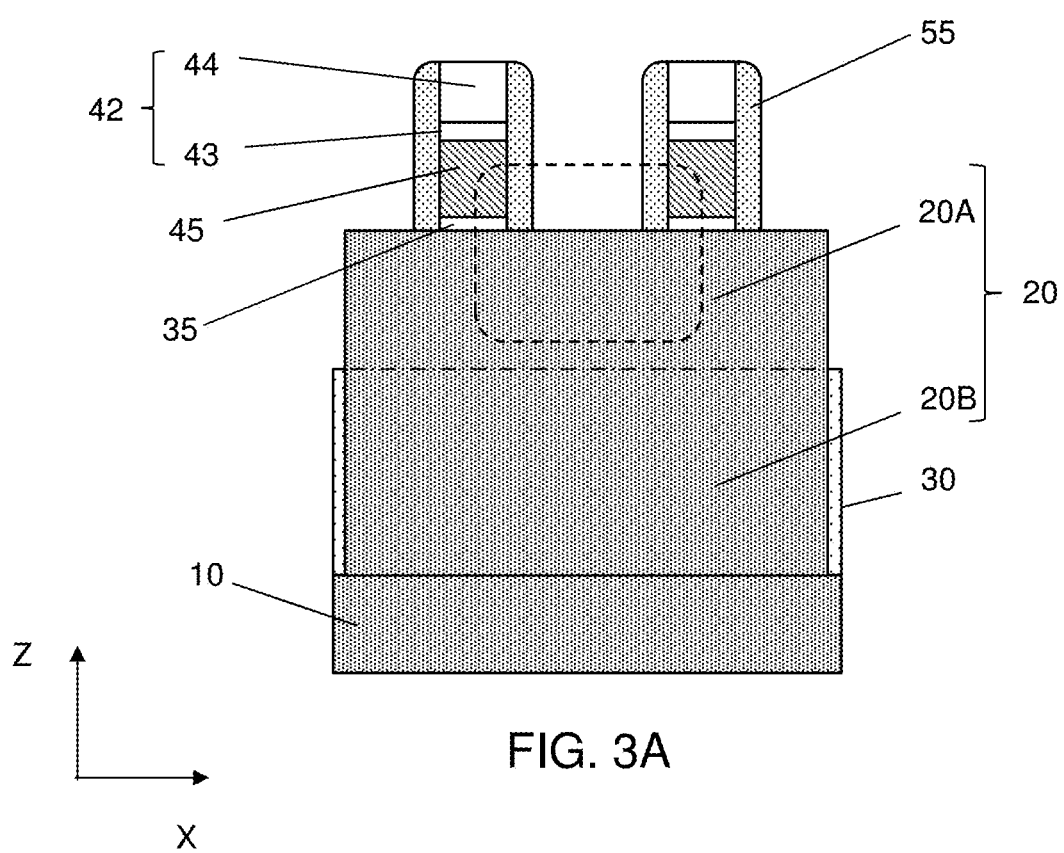
Figure 3B:
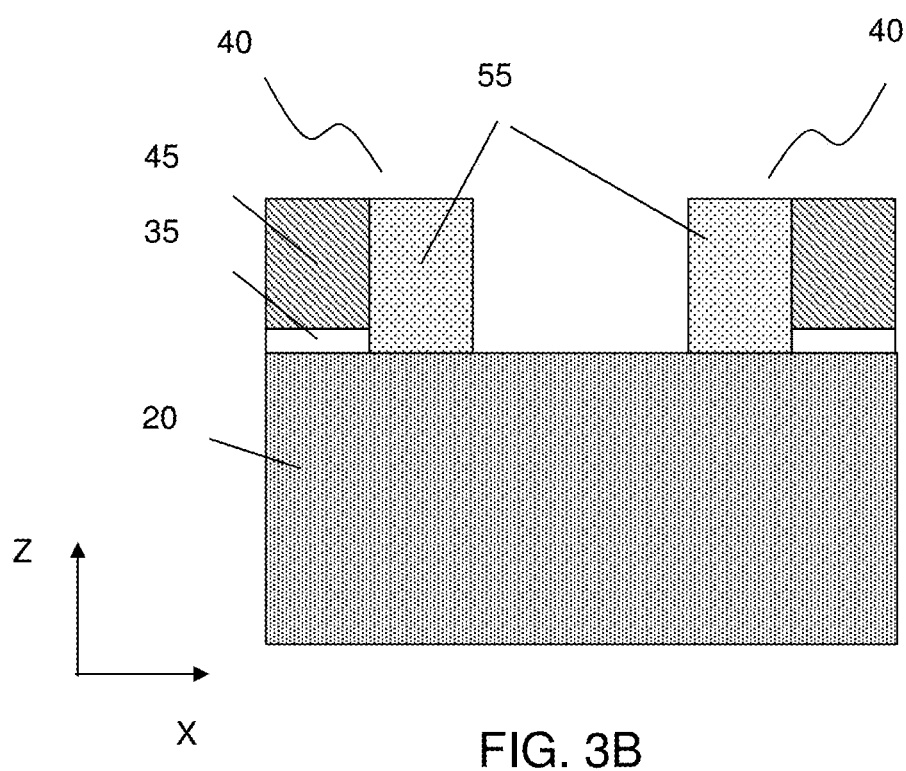

Further, as shown in FIGS. 3A and 3B, sidewall spacers 55 are formed on opposite side faces of the gate structures 40. FIG. 3B is an enlarged view of a source/drain region of FIG. 3A. An insulating material layer for sidewall spacers 55 is formed over the gate structure 40. The insulating material layer is deposited in a conformal manner so that it is formed to have substantially equal thicknesses on vertical surfaces, such as the sidewalls, horizontal surfaces, and the top of the gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, as shown in FIGS. 3A and 3B, bottom portions of the insulating material layer are removed by anisotropic etching, thereby forming sidewall spacers 55. In some embodiments, the sidewall spacers 55 include two to four layers of different insulating materials.

Figure 4A:
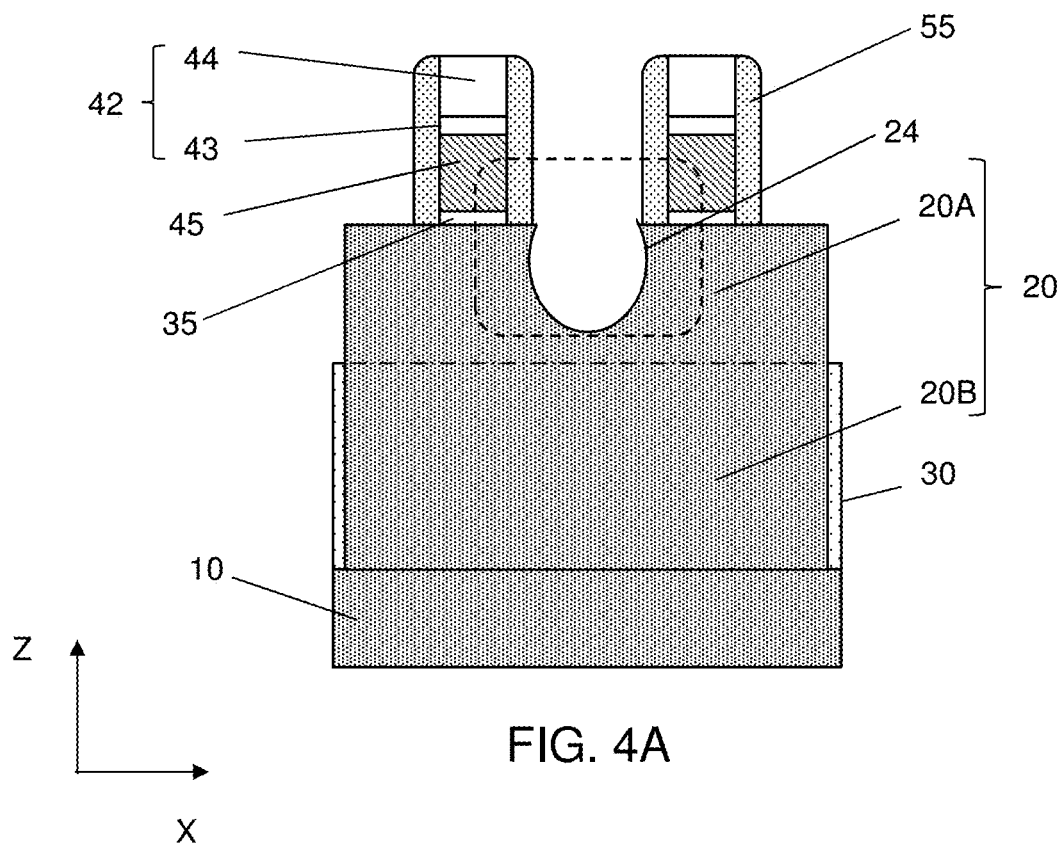
Figure 4B:
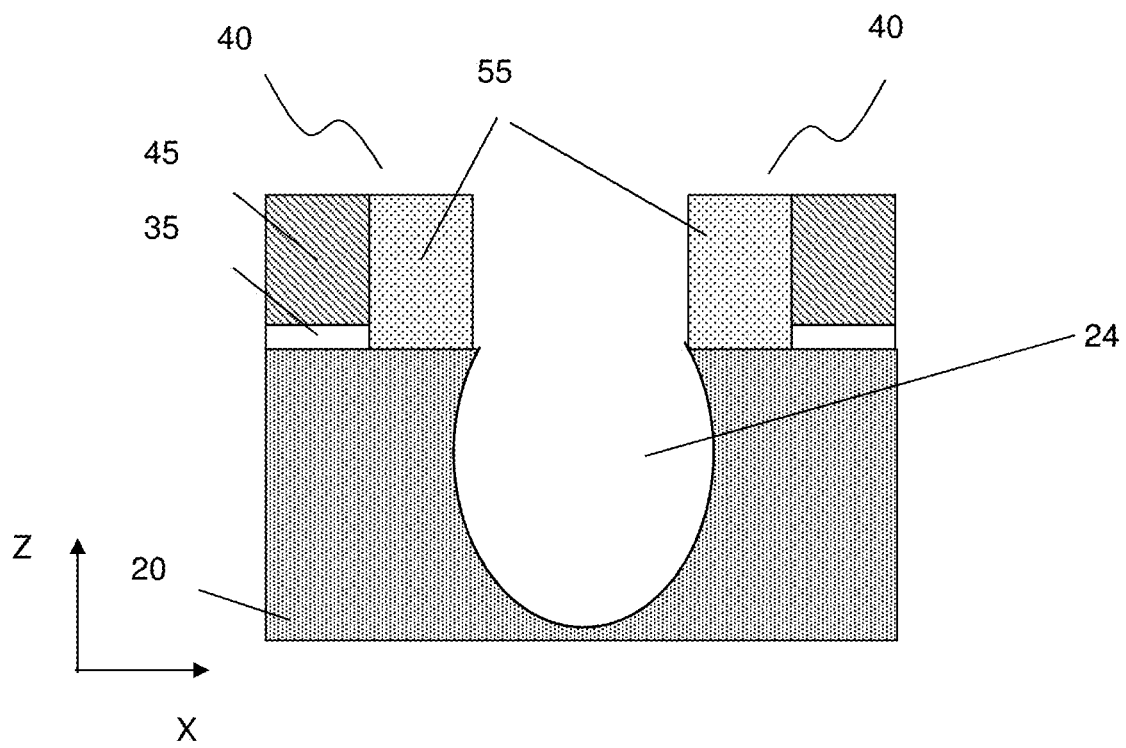

Subsequently, as shown in FIGS. 4A and 4B, a source/drain region of the fin structure 20 not covered by the gate structure 40 is etched down (recessed) to form a source/drain recess 24. FIG. 4B is an enlarged view of a source/drain region of FIG. 4A. As shown in FIGS. 4A and 4B, the cross sectional shape in the Z-X plane of the source/drain recess 24 has a rounded shape in some embodiments. In some embodiments, the source/drain recess 24 has a U-shape cross section having a substantially vertical side wall and a rounded bottom. A depth of the source/drain recess 24 is in a range from about 30 nm to about 100 nm in some embodiments, and is in a range of about 40 nm to about 60 nm in other embodiments.

Figure 5A:
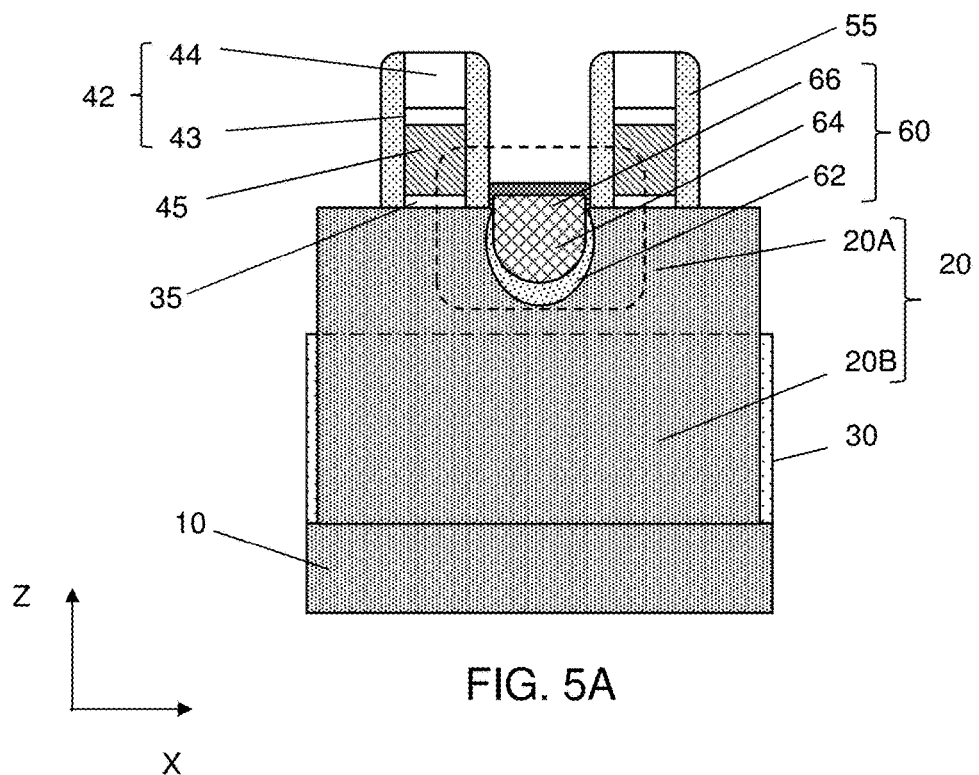
Figure 5B:
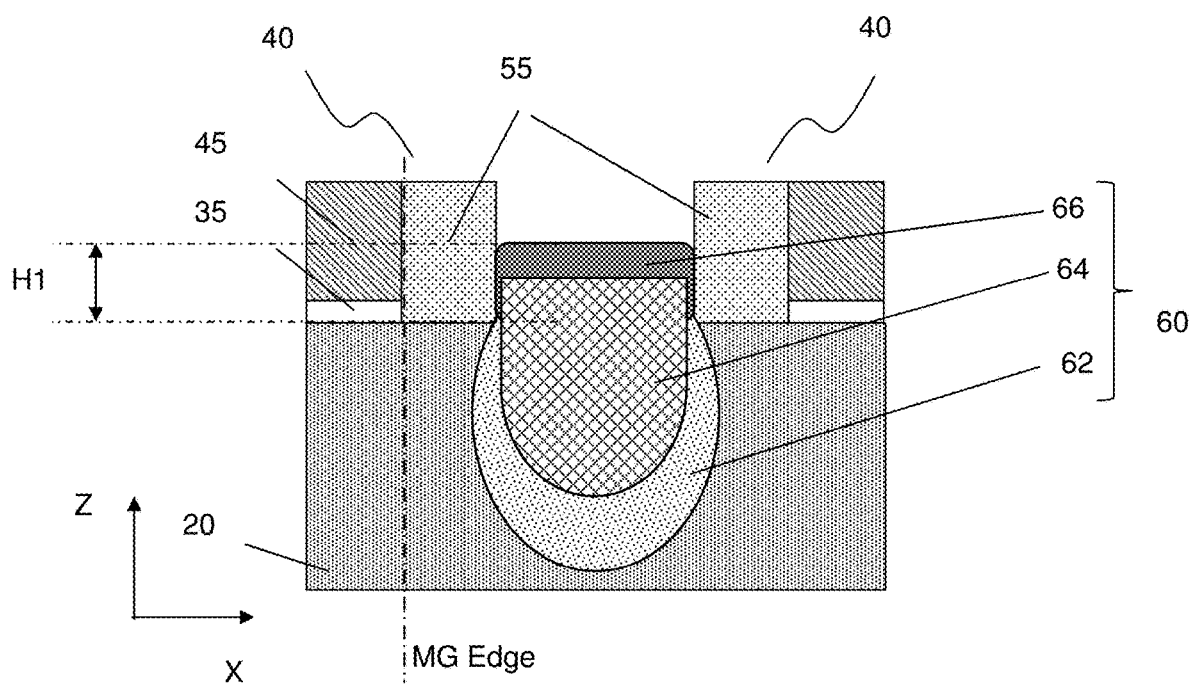

After the source/drain recess 24 is formed, one or more source/drain epitaxial layers 60 are formed in the source/drain recess 24, as shown in FIGS. 5A and 5B. In some embodiments, a first epitaxial layer 62, a second epitaxial layer 64 and a third epitaxial layer 66 are formed. In other embodiments, no third epitaxial layer is formed.

In some embodiments, the first epitaxial layer 62 includes Si and an element larger in atomic mass than phosphorous (P). In certain embodiments, the first epitaxial layer 62 is an arsenic (As) containing layer, such as a SiAs epitaxial layer or a SiCAs epitaxial layer. A thickness of the first epitaxial layer 62 is in a range from about 1 nm to about 15 nm in some embodiments and is in a range from about 2 nm to about 10 nm in other embodiments. An amount of As in the first epitaxial layer 62 is in a range from about $1 \times 10^{20}$ atoms/cm$^3$ to about $1 \times 10^{21}$ atoms/cm$^3$, in some embodiments. In other embodiments, a Sb containing layer is used as the first epitaxial layer 62.

After forming the first epitaxial layer 62, a second epitaxial layer 64 is formed over the first epitaxial layer 62. In some embodiments, the second epitaxial layer 64 is a P containing layer, such as a SiP layer or a SiCP layer. In certain embodiments, the second epitaxial layer 64 is a SiP layer. In some embodiments, an amount of P in the second epitaxial layer 64 is in a range about $5 \times 10^{20}$ atoms/cm$^3$ to about $5 \times 10^{21}$ atoms/cm$^3$, and is in a range about $6 \times 10^{20}$ atoms/cm$^3$ to about $4 \times 10^{21}$ atoms/cm$^3$ in other embodiments. The thickness of the second epitaxial layer 64 is in a range of about 5 nm to 60 nm in this embodiment, or in a range of about 10 nm to about 50 nm in other embodiments.

After forming the second epitaxial layer 64, a third epitaxial layer 66 may be formed over the second epitaxial layer 64. The third epitaxial layer 66 includes a SiP layer, a SiAs layer or a SiCAs layer. When the third epitaxial layer 66 is a SiP layer, an amount of P in the third epitaxial layer 66 is less than the amount of P in the second epitaxial layer 66. In some embodiments, the amount of P in the third epitaxial layer 66 is in a range of about $6 \times 10^{20}$ atoms/cm$^3$ to about $1 \times 10^{21}$ atoms/cm$^3$. When the third epitaxial layer 66 is an As containing layer, the amount of As in the third epitaxial layer 66 is in a range of about $6 \times 10^{20}$ atoms/cm$^3$ to about $1 \times 10^{21}$ atoms/cm$^3$ in some embodiments.

In at least one embodiment, the epitaxial layers 62, 64 and 66 are epitaxially-grown by an LPCVD process, molecular beam epitaxy, atomic layer deposition or any other suitable method. The epitaxial process is performed at a temperature of about 500° C. to 800° C. and under a pressure of about 1 to 200 Torr, using a silicon source gas such as SiH$_4$, Si$_2$H$_6$, or Si$_3$H$_8$; a carbon source gas such as CH$_4$ and C$_2$H$_6$; an arsenic source gas such as AsH$_3$; and/or a phosphorus source gas such as PH$_3$.

Figure 5C:
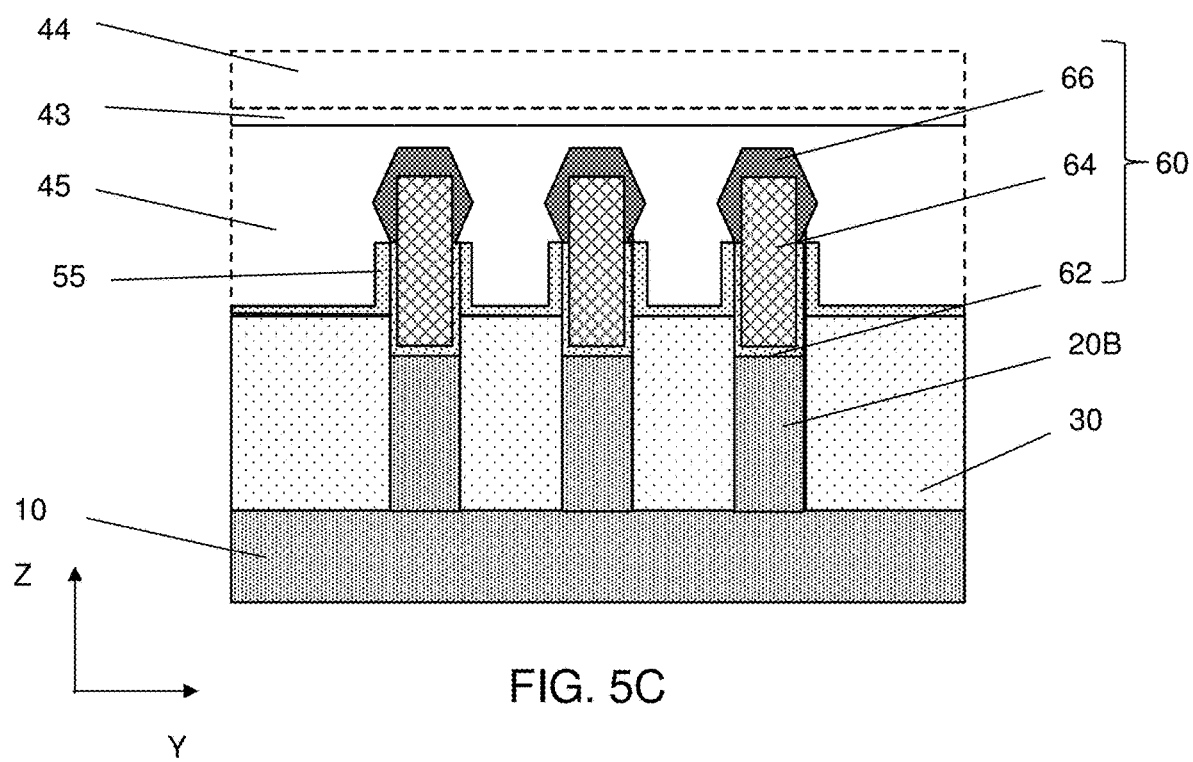

FIG. 5C is a cross sectional view cutting the source/drain region along the Y direction. In some embodiments, the sidewall spacers 55 formed on the fin structure partially remain, between which the source/drain recess 24 is located. In some embodiments, the bottom of the source/drain recess 24 is located below the upper surface of the isolation insulating layer 30. In some embodiments, the first epitaxial layer 62 is conformally formed in the source/drain recess 24. In some embodiments, the second epitaxial layer 64 is formed to protrude from the remaining sidewall spacers 55. In some embodiments, the third epitaxial layer 66 is in contact with the top of the first epitaxial layer 62.

In some embodiments, the height H1 from the top of the fin structure 20 and the top of the source/drain (S/D) epitaxial layer 60 shown in FIG. 5B is in a range from about 5 nm to about 10 nm.

In some embodiments, the first epitaxial layer 62 includes at least one selected from the group consisting of a SiAs layer, SiCAs and a SiPAs layer. In some embodiments, the first epitaxial layer 62 includes a single SiAs layer. In other embodiments, the first epitaxial layer 62 is a single SiCAs layer. In some embodiments, the first epitaxial layer is a single SiPAs layer. In some embodiments, the second epitaxial layer 64 includes a SiP layer.

In some embodiments, the third epitaxial layer 66 includes at least one selected from the group consisting of a SiAs layer, a SiPAs layer, a SiC layer, a SiCAs layer, SiP layer and a SiCP layer. In some embodiments, the third epitaxial layer 66 includes a single SiAs layer. In some embodiments, the third epitaxial layer 66 is a single SiCAs layer. In some embodiments, the third epitaxial layer 66 is a single SiC layer. In some embodiments, the third epitaxial layer 66 is a SiCP layer. In some embodiments, the third epitaxial layer 66 includes a SiP layer having a lower P concentration than the second epitaxial layer 64.

In some embodiments, the second epitaxial layer 64 has a greater thickness than the first epitaxial layer 62 and the third epitaxial layer 66. In some embodiments, a thickness of the first epitaxial layer 62 is in a range from about 0.5 nm to about 5 nm, and is in a range from about 1 nm to about 3 nm in other embodiments. In some embodiments, a thickness of the third epitaxial layer 66 is in a range from about 0.5 nm to about 5 nm, and is in a range from about 1 nm to about 3 nm in other embodiments.

In some embodiments, the first epitaxial layer 62 includes an As containing layer, such as a SiAs layer and/or a SiCAs layer, and a concentration of As in the SiAs and/or SiCAs layer is in a range from about $1 \times 10^{20}$ atoms/cm$^3$ to about $5 \times 10^{21}$ atoms/cm$^3$. In some embodiments, the second epitaxial layer 64 includes a SiP layer, and a concentration of P in the SiP layer is in a range from about $1 \times 10^{20}$ atoms/cm$^3$ to about $5 \times 10^{21}$ atoms/cm$^3$. In some embodiments, the third epitaxial layer 66 includes an As containing layer, such as a SiAs and/or SiCAs layer, and a concentration of As in the SiAs and/or SiCAs layer is in a range from about $1 \times 10^{20}$ atoms/cm$^3$ to about $5 \times 10^{21}$ atoms/cm$^3$.

In some embodiments, the first epitaxial layer 62 is one or more of SiAs, SiCAs, and SiPAs layers, the second epitaxial layer 64 is a SiP layer, and the third epitaxial layer 66 is one or more of SiAs, SiC, SiCAs, and SiCP layers. In some embodiments, the first epitaxial layer 62 is one or more of SiAs, SiC, SiCAs, and SiCP layers, the second epitaxial layer 64 is a SiP layer, and the third epitaxial layer 66 is a SiP layer having different P concentration (e.g., smaller or larger) than the second epitaxial layer 64. In some embodiments, the first epitaxial layer 62 is one or more of SiAs, SiC, SiCAs, and SiCP layers, the second epitaxial layer 64 is one or more of SiAs, SiC, SiCAs, and SiCP layers, and the third epitaxial layer 66 one or more of SiAs, SiC, SiCAs, and SiCP layers. In some embodiments, concentrations of As, C and/or P are different in the first, second and/or third epitaxial layers. In some embodiments, the first to third epitaxial layers includes As (e.g., SiAs), and the concentration of As in the second epitaxial layer is greater than the concentration of As in the first and third epitaxial layers, and the concentration of As in the third epitaxial layer is greater than the concentration of As in the first epitaxial layer.

Figure 6:
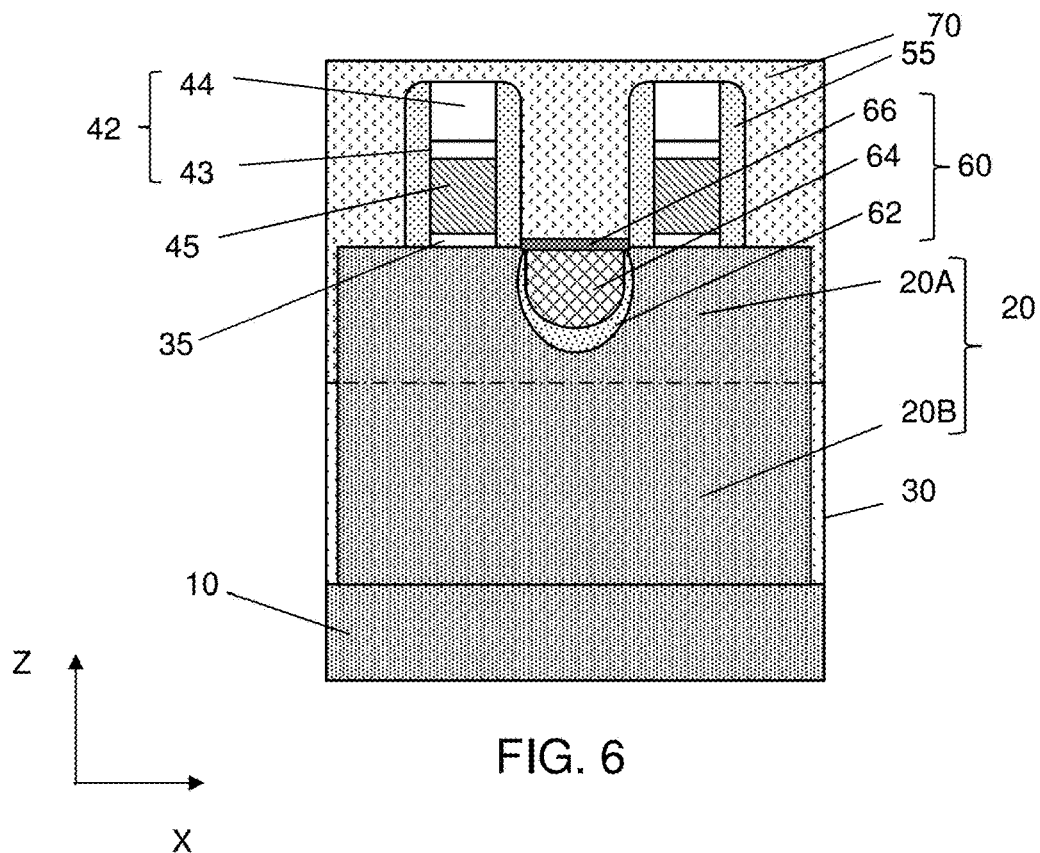

Then, as shown in FIG. 6, an interlayer dielectric (ILD) layer 70 is formed over the S/D epitaxial layer 60 and the sacrificial gate structure 40. The materials for the ILD layer 70 include compounds comprising Si, O, C and/or H, such as silicon oxide, SiCOH and SiOC. Organic materials, such as polymers, may be used for the ILD layer 70. In some embodiments, before the ILD layer 70 is formed, a contact etch stop layer, such as a silicon nitride layer or a silicon oxynitride layer, is formed.

Figure 7:
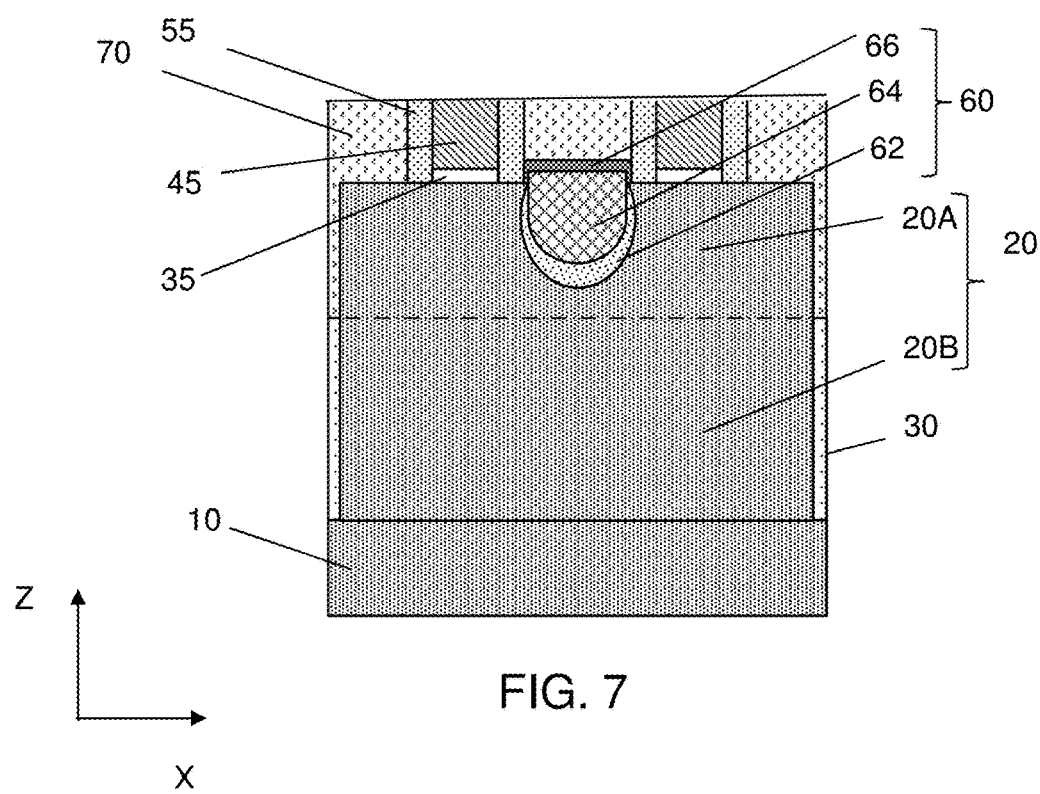

After the ILD layer 70 is formed, a planarization operation, such as CMP, is performed, so that the top portion of the sacrificial gate electrode layer 45 is exposed, as shown in FIG. 7.

Figure 8:
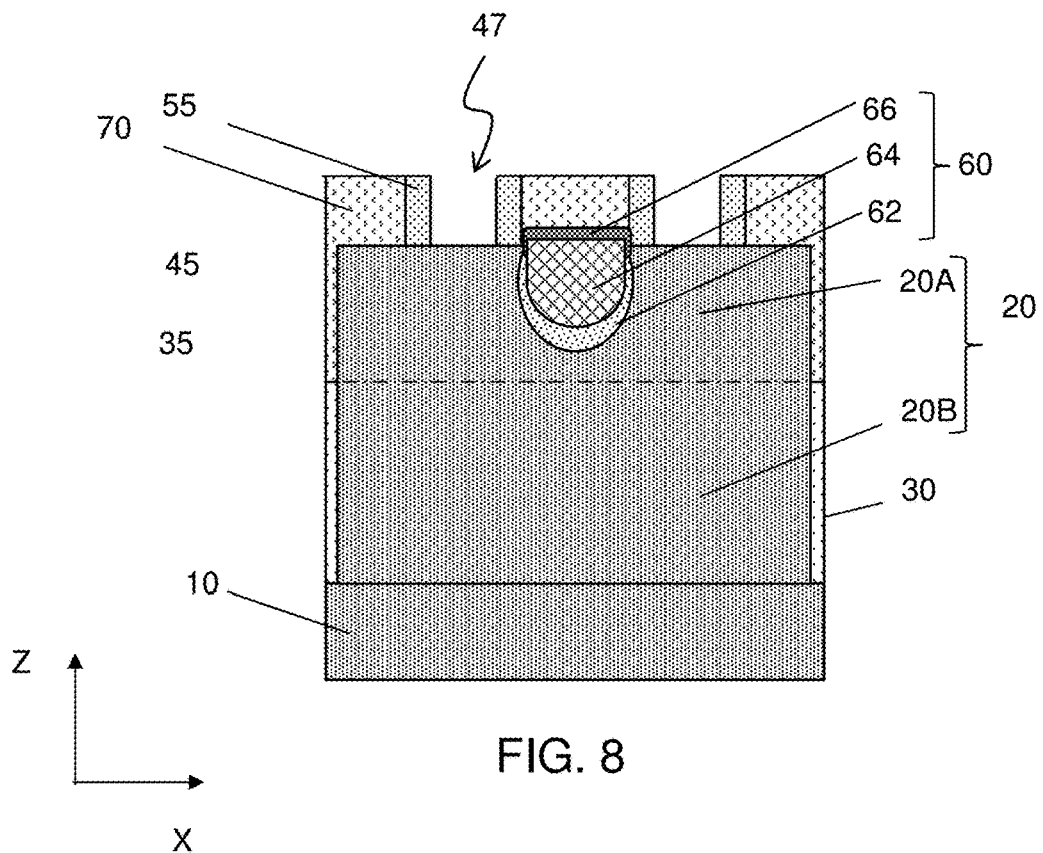

Then, the sacrificial gate electrode layer 45 and the sacrificial gate dielectric layer 35 are removed, thereby forming a gate space 47 as shown in FIG. 8. The sacrificial gate structures can be removed using plasma dry etching and/or wet etching. When the sacrificial gate electrode layer 45 is polysilicon and the ILD layer 70 is silicon oxide, a wet etchant such as a TMAH solution can be used to selectively remove the sacrificial gate electrode layer 45. The sacrificial gate dielectric layer 35 is thereafter removed using plasma dry etching and/or wet etching as shown in FIG. 8.

Figure 9:
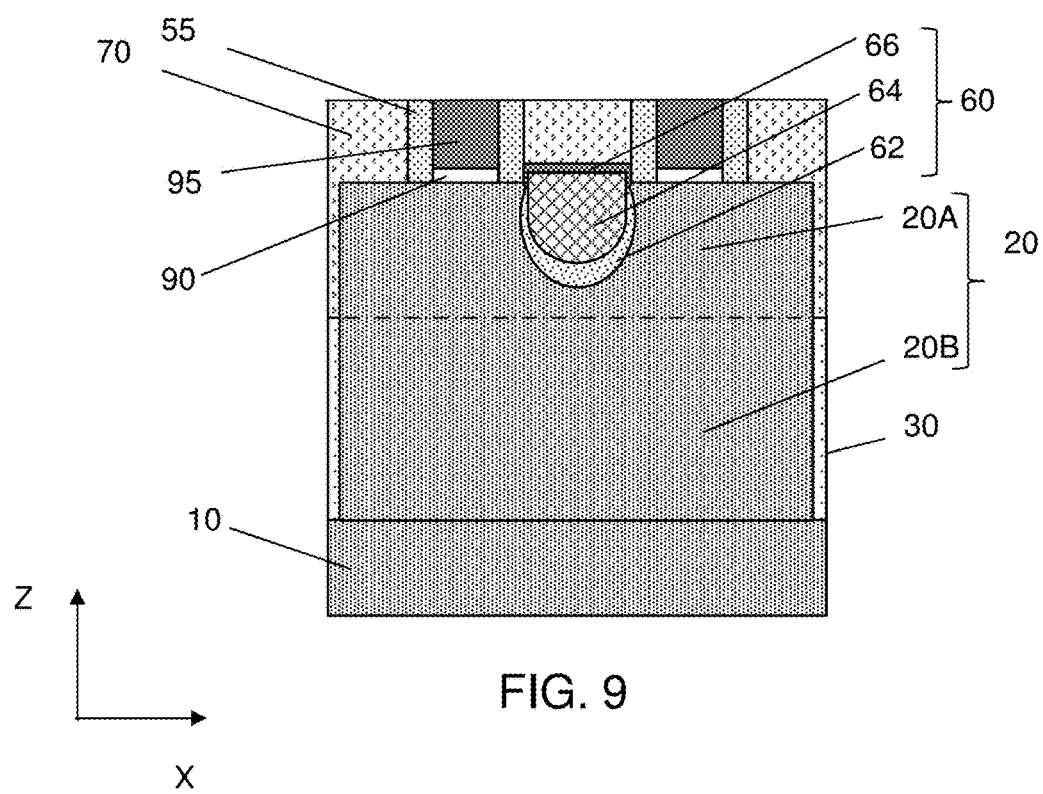

After the sacrificial gate electrode layer 45 and the sacrificial gate dielectric layer 35 are removed, a gate dielectric layer 90 and a gate electrode 95 are formed in the gate space 47, as shown in FIG. 9. In some embodiments, the gate dielectric layer 90 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 90 includes an interfacial layer formed between the channel layer and the dielectric material, by using chemical oxidation. The gate dielectric layer 90 may be formed by CVD, ALD or any suitable method. In one embodiment, the gate dielectric layer 90 is formed using a highly conformal deposition process such as ALD in order to ensure the formation of a gate dielectric layer having a uniform thickness around each channel layer. The thickness of the gate dielectric layer 90 is in a range from about 1 nm to about 10 nm in one embodiment.

Subsequently, a gate electrode layer 95 is formed on the gate dielectric layer 90. The gate electrode layer 95 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 95 may be formed by CVD, ALD, electro-plating, or other suitable method. The metals for the gate dielectric layer 90 and the gate electrode layer 95 are also deposited over the upper surface of the first ILD layer 70. The material for the gate electrode layer formed over the ILD layer 70 is then planarized by using, for example, CMP, until the top surface of the ILD layer 70 is revealed.

In certain embodiments of the present disclosure, one or more work function adjustment layers (not shown) are interposed between the gate dielectric layer 90 and the gate electrode layer 95. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

In some embodiments, after the planarization operation, the metal gate electrode layer 95 is recessed and a cap insulating layer (not shown) is formed over the recessed gate electrode layer. The cap insulating layer includes one or more layers of a silicon nitride-based material, such as SiN. The cap insulating layer can be formed by depositing an insulating material followed by a planarization operation.

Figure 10:
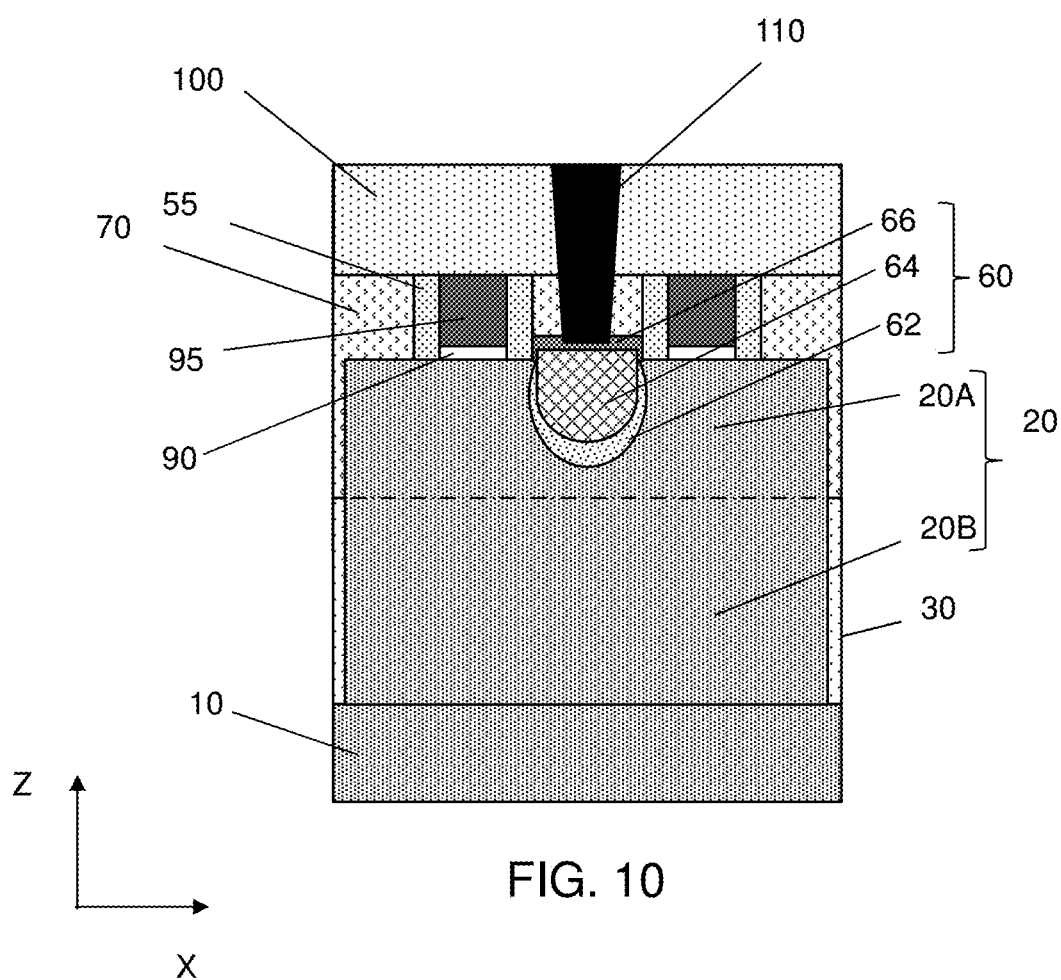

Subsequently, an additional ILD layer 100 is formed and a conductive contact layer 110 is formed in contact with the source/drain epitaxial layer 60, as shown in FIG. 10. The material for the conductive contact layer 110 includes one or more of Co, W, Ni, Mo and an alloy thereof.

It is understood that the FET undergoes further CMOS processes to form various features such as contacts/vias, interconnect metal layers, dielectric layers, passivation layers, etc.

Figure 11:
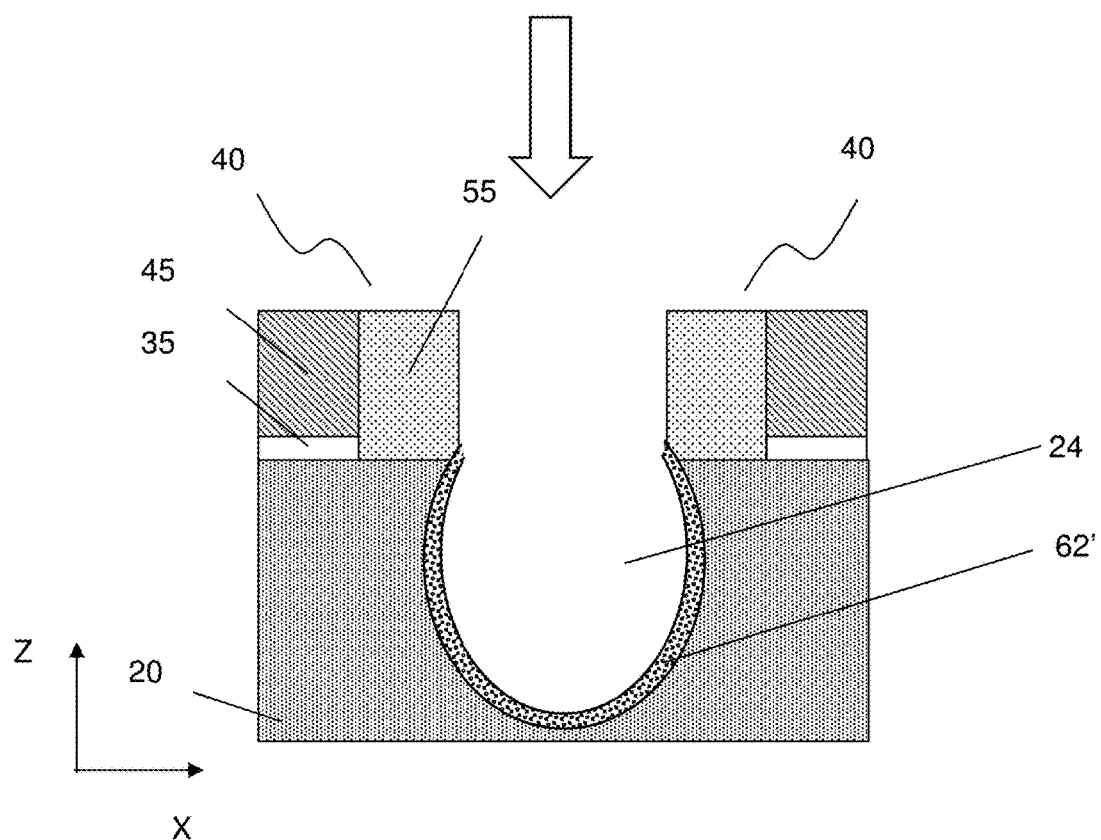
Figure 12:
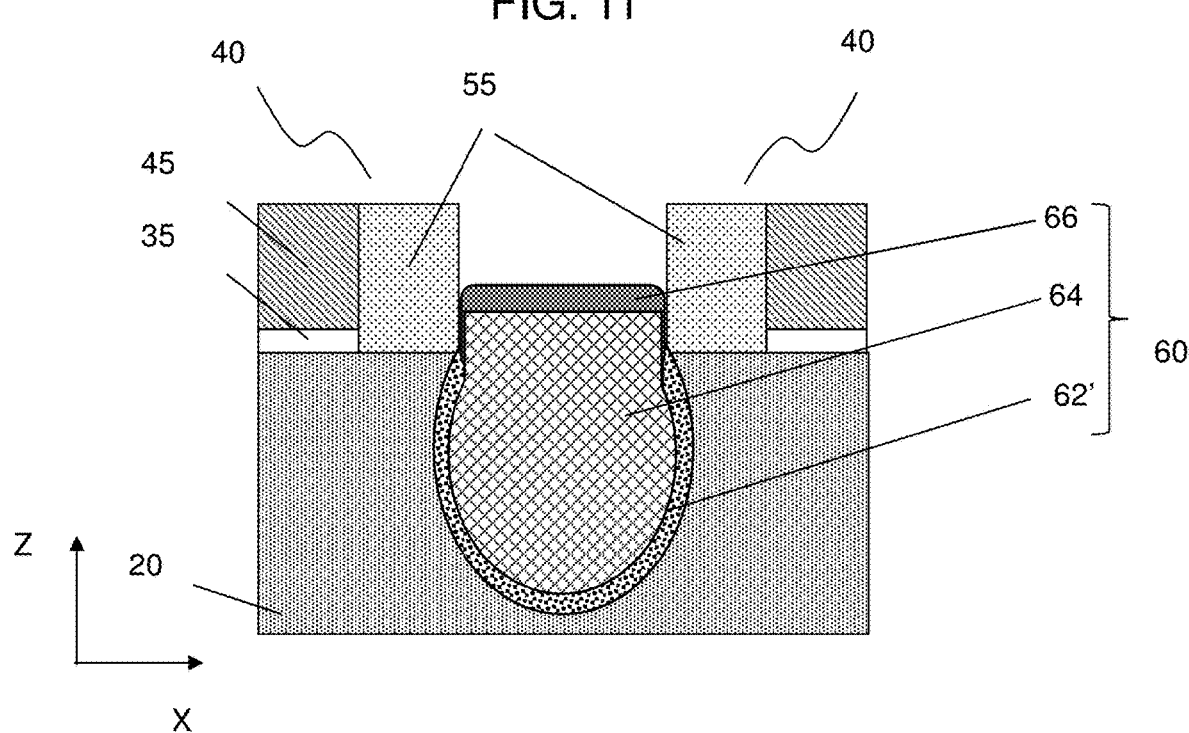

FIGS. 11 and 12 show views of various stages of a sequential manufacturing operation of a semiconductor device according to the present disclosure. It is understood that additional operations may be provided before, during, and after the processes shown by FIGS. 11 and 12, and some of the operations described below can be replaced or eliminated for additional embodiments of the method. The order of the operations/processes may be interchangeable. Materials, configurations, dimensions, processes and/or operations described with respect to FIGS. 1-10 may be employed in the following embodiments, and detailed explanation thereof may be omitted.

In this embodiment, instead of or in addition to forming the As containing first epitaxial layer 62, an As implantation operation is performed to introduce As into the source/drain recess 24 to form an As containing layer 62'. After the structure shown in FIGS. 4A and 4B is formed, one or more ion implantation operations are performed, as shown in FIG. 11. In some embodiments, a dose amount of As is in a range of about $1 \times 10^{14}$ ions/cm$^2$ to about $6 \times 10^{15}$ ions/cm$^2$. The acceleration voltage is in a range from about 1 keV to about 5 keV in some embodiments. In some embodiments, a tilted ion implantation with an angle within ±60 degrees with respect the vertical direction (normal direction of the wafer) is performed. Multiple implantations with changing tilt angles are performed in some embodiments. In some embodiments, after the ion implantation, an annealing operation is performed. A temperature in the annealing operation is in a range from about 800° C. to about 1000° C. in some embodiments. The annealing time is in a range from 1 msec to 100 msec in some embodiments. The As implantation can create an As containing silicon layer 62' having a thickness in a range from about 0.5 nm to about 5 nm in some embodiments. In other embodiments, As ions are directly implanted into the fin structure 20 without forming the first epitaxial layer.

In other embodiments, a plasma doping operation or other suitable impurity doping operations are performed to form an As containing layer in the source/drain recess 24.

After the As containing layer 62' is formed, a second epitaxial layer 64 and the third epitaxial layer 66 are formed as shown in FIG. 12. In some embodiments, the second epitaxial layer 64 is one or more of SiAs, SiC, SiCAs, and SiCP layers, and the third epitaxial layer 66 one or more of SiAs, SiC, SiCAs, and SiCP layers. After the third epitaxial layer 66 is formed, the subsequent operations explained with respect to FIGS. 6-10 are performed.

Figure 13:
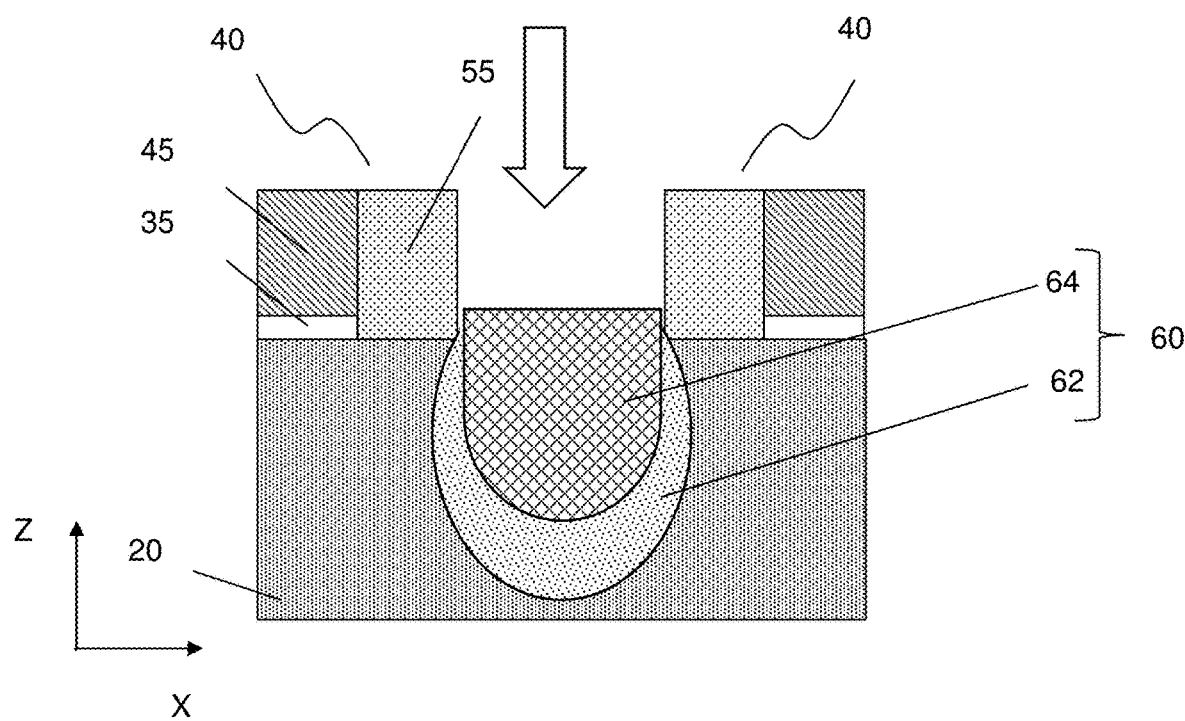
Figure 14:
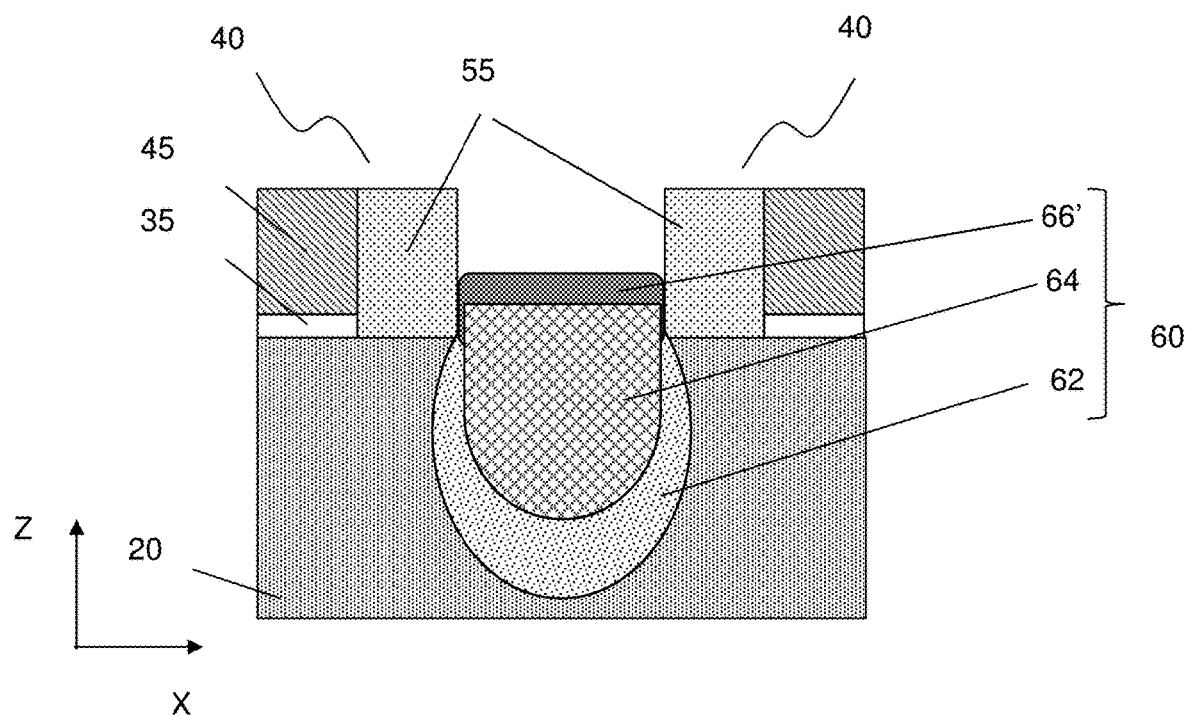

FIGS. 13 and 14 show views of various stages of a sequential manufacturing operation of a semiconductor device according to the present disclosure. It is understood that additional operations may be provided before, during, and after the processes shown by FIGS. 13 and 14, and some of the operations described below can be replaced or eliminated for additional embodiments of the method. The order of the operations/processes may be interchangeable. Materials, configurations, dimensions, processes and/or operations described with respect to FIGS. 1-12 may be employed in the following embodiments, and detailed explanation thereof may be omitted.

In this embodiment, instead of or in addition to forming the third epitaxial layer 66, an As and/or P implantation operation is performed to introduce As and/or P into the second or third epitaxial layer to form the As and/or P containing layer 66'. After the first epitaxial layer 62 and the second epitaxial layer 64 are formed, one or more ion implantation operations are performed as shown in FIG. 13. In some embodiments, the first epitaxial layer 62 is one or more of SiAs, SiCAs, and SiPAs layers, and the second epitaxial layer 64 is one or more of SiAs, SiC, SiCAs, and SiCP layers. In some embodiments, a dose amount of As is in a range of about $1 \times 10^{14}$ ions/cm$^2$ to about $6 \times 10^{15}$ ions/cm$^2$. In some embodiments, a dose amount of P is in a range of about $1 \times 10^{14}$ ions/cm$^2$ to about $6 \times 10^{15}$ ions/cm$^2$. In certain embodiments, both As and P are introduced by ion implantation operations. The acceleration voltage is in a range from about 1 keV to about 5 keV in some embodiments. In some embodiments, a tilted ion implantation with an angle within ±60 degrees with respect to the vertical direction is performed. Multiple implantations with changing tilt angles are performed in some embodiments. In some embodiments, after the ion implantation, an annealing operation is performed. A temperature in the annealing operation is in a range from about 800° C. to about 1000° C. in some embodiments. The annealing time is in a range from 1 msec to 100 msec in some embodiments. The As and/or P implantation can create an As and/or P containing silicon layer having a thickness in a range from about 0.5 nm to about 5 nm in some embodiments.

In other embodiments, a plasma doping operation or other suitable impurity doping operations are performed to form an As and/or P containing layer in the source/drain recess 24.

After the As and/or P containing layer 66' is formed, subsequent operations explained with respect to FIGS. 6-10 are performed.

In some embodiments, a doping peak (for example, As) in the source/drain epitaxial layer is observed in a range from about 3 nm to about 8 nm from the gate electrode edge (MG edge).

It will be understood that not all advantages have been necessarily discussed herein, no particular advantage is required for all embodiments or examples, and other embodiments or examples may offer different advantages.

For example, in the present disclosure, since an As containing layer is formed as the first epitaxial layer or formed by implanting As instead of the first epitaxial layer, it is possible to prevent out-diffusion of P from the SiP body layer into the channel region. Further, it is possible to form a SiP body layer with a higher P concentration to reduce resistivity. Moreover, since one or more of As containing and P containing layers are also formed on the SiP body, it is also possible to prevent the P out-gassing during contact metallization.

In accordance with one aspect of the present disclosure, a semiconductor device, includes a channel region, and a source/drain region adjacent to the channel region. The source/drain region includes a first layer, a second epitaxial layer epitaxially formed on the first layer and a third epitaxial layer epitaxially formed on the second epitaxial layer, and the first layer contains As. In one or more of the foregoing and the following embodiments, the second epitaxial layer does not include As. In one or more of the foregoing and the following embodiments, the second epitaxial layer is made of SiP. In one or more of the foregoing and the following embodiments, the third epitaxial layer is made of SiP having a different P concentration than the second epitaxial layer. In one or more of the foregoing and the following embodiments, a P concentration of the third epitaxial layer is lower than a P concentration of the second epitaxial layer. In one or more of the foregoing and the following embodiments, the third epitaxial layer is made of SiAs. In one or more of the foregoing and the following embodiments, the second epitaxial layer has a greater thickness than the first layer and the second epitaxial layer. In one or more of the foregoing and the following embodiments, a thickness of the first layer is in a range from 2 nm to 10 nm. In one or more of the foregoing and the following embodiments, a thickness of the third epitaxial layer is in a range from 2 nm to 5 nm. In one or more of the foregoing and the following embodiments, the first layer is an epitaxial layer containing As. In one or more of the foregoing and the following embodiments, a concentration of As in the first layer is in a range from $1\times10^{20}$ atoms/cm$^3$ to $1\times10^{21}$ atoms/cm$^3$. In one or more of the foregoing and the following embodiments, the second epitaxial layer includes a SiP layer, and a concentration of P in the SiP layer is in a range from $6\times10^{20}$ atoms/cm$^3$ to $4\times10^{21}$ atoms/cm$^3$. In one or more of the foregoing and the following embodiments, the third epitaxial layer includes a SiAs layer, and a concentration of As in the SiAs layer is in a range from $6\times10^{20}$ atoms/cm$^3$ to $1\times10^{21}$ atoms/cm$^3$. In one or more of the foregoing and the following embodiments, the third epitaxial layer includes a SiP layer, and a concentration of P in the SiP layer is in a range from $6\times10^{20}$ atoms/cm$^3$ to $1\times10^{21}$ atoms/cm$^3$. In one or more of the foregoing and the following embodiments, the semiconductor device is a fin field effect transistor.

In accordance with another aspect of the present disclosure, a semiconductor device includes a channel region, and a source/drain region made of a semiconductor layer and disposed adjacent to the channel region. The source/drain region includes a first epitaxial layer and a second epitaxial layer epitaxially formed on the first epitaxial layer, and an As containing layer is formed under the first epitaxial layer. In one or more of the foregoing and the following embodiments, a thickness of the As containing layer is in a range from 0.5 nm to 5 nm. In one or more of the foregoing and the following embodiments, the first epitaxial layer is a SiP layer. In one or more of the foregoing and the following embodiments, the second epitaxial layer includes one or more of a SiAs layer, a SiCAs layer and a SiCP layer. In one or more of the foregoing and the following embodiments, a thickness of the third epitaxial layer is in a range from 2 nm to 5 nm.

In accordance with another aspect of the present disclosure, in a method of manufacturing a semiconductor device, a first epitaxial layer is formed over a source/drain region, a second epitaxial layer is formed over the first epitaxial layer, and a third epitaxial layer is formed over the second epitaxial layer. The first epitaxial layer is made of SiAs. In one or more of the foregoing and the following embodiments, the second epitaxial layer does not include As. In one or more of the foregoing and the following embodiments, the second epitaxial layer is made of SiP. In one or more of the foregoing and the following embodiments, the third epitaxial layer is made of SiP having a different P concentration than the second epitaxial layer. In one or more of the foregoing and the following embodiments, a P concentration of the third epitaxial layer is lower than a P concentration of the second epitaxial layer. In one or more of the foregoing and the following embodiments, the third epitaxial layer is made of SiAs. In one or more of the foregoing and the following embodiments, the second epitaxial layer has a greater thickness than the first epitaxial layer and the second epitaxial layer. In one or more of the foregoing and the following embodiments, the first layer is an epitaxial layer containing As. In one or more of the foregoing and the following embodiments, a thickness of the first epitaxial layer is in a range from 2 nm to 10 nm. In one or more of the foregoing and the following embodiments, a thickness of the third epitaxial layer is in a range from 2 nm to 5 nm. In one or more of the foregoing and the following embodiments, a concentration of As in the first epitaxial layer is in a range from $1\times10^{20}$ atoms/cm$^3$ to $1\times10^{21}$ atoms/cm$^3$. In one or more of the foregoing and the following embodiments, the second epitaxial layer includes a SiP layer, and a concentration of P in the SiP layer is in a range from $6\times10^{20}$ atoms/cm$^3$ to $4\times10^{21}$ atoms/cm$^3$. In one or more of the foregoing and the following embodiments, the third epitaxial layer includes a SiAs layer, and a concentration of As in the SiAs layer is in a range from $6\times10^{20}$ atoms/cm$^3$ to $1\times10^{21}$ atoms/cm$^3$. In one or more of the foregoing and the following embodiments, the third epitaxial layer includes a SiP layer, and a concentration of P in the SiP layer is in a range from $6\times10^{20}$ atoms/cm$^3$ to $1\times10^{21}$ atoms/cm$^3$. In one or more of the foregoing and the following embodiments, the semiconductor device is a fin field effect transistor. In one or more of the foregoing and the following embodiments, a recess is formed in the source/drain region of a semiconductor layer, and the first epitaxial layer is formed in the recess.

In accordance with another aspect of the present disclosure, in a method of manufacturing a semiconductor device, a recess is formed in a source/drain region of a semiconductor layer, ions are implanted into the recess to form an implanted layer, and one or more epitaxial layers are formed on the implanted layer. In one or more of the foregoing and the following embodiments, As is implanted in the implanting to form an As containing layer as the implanted layer. In one or more of the foregoing and the following embodiments, forming the one or more epitaxial layer includes forming a first epitaxial layer on the implanted layer, forming a second epitaxial layer over the first epitaxial layer, and forming a third epitaxial layer over the second epitaxial layer. The first epitaxial layer is made of SiAs. In one or more of the foregoing and the following embodiments, forming the one or more epitaxial layer includes forming a first epitaxial layer on the implanted layer, and forming a second epitaxial layer over the first epitaxial layer. The first epitaxial layer is made of SiP.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin structure having a channel region protruding from an isolation insulating layer; and
a source/drain region adjacent to the channel region, wherein:
the source/drain region includes a first layer, a second epitaxial layer epitaxially formed on the first layer and a third epitaxial layer epitaxially formed on the second epitaxial layer,
the first layer is made of SiAs,
the second epitaxial layer is made of SiP,
the third epitaxial layer is made of SiP, and
a P concentration of the third epitaxial layer is lower than a P concentration of the second epitaxial layer.

2. The semiconductor device of claim 1, wherein the second epitaxial layer does not include As.

3. The semiconductor device of claim 1, wherein the third epitaxial layer contain As.

4. The semiconductor device of claim 1, wherein the second epitaxial layer has a greater thickness than the first layer and the third epitaxial layer.

5. The semiconductor device of claim 1, wherein a concentration of As in the SiAs layer is in a range from $1\times10^{20}$ atoms/cm$^3$ to $1\times10^{21}$ atoms/cm$^3$.

6. The semiconductor device of claim 1, wherein:
a concentration of P in the second epitaxial layer is in a range from $6\times10^{20}$ atoms/cm$^3$ to $4\times10^{21}$ atoms/cm$^3$.

7. The semiconductor device of claim 1, wherein:
the third epitaxial layer contains As, and
a concentration of As in the third epitaxial layer is in a range from $6\times10^{20}$ atoms/cm$^3$ to $1\times10^{21}$ atoms/cm$^3$.

8. The semiconductor device of claim 1, wherein:
a concentration of P in the third epitaxial layer is in a range from $6\times10^{20}$ atoms/cm$^3$ to $1\times10^{21}$ atoms/cm$^3$.

9. The semiconductor device of claim 1, wherein:
the first layer consists of SiAs,
the second epitaxial layer consists of SiP, and
the third epitaxial layer consists of SiP.

10. The semiconductor device of claim 1, wherein a bottom of the second epitaxial layer is located below an upper surface of the isolation insulating layer.

11. The semiconductor device of claim 1, wherein:
the fin structure extends in a first direction, and
the first layer has a U-shape in a cross section along the first direction and in a cross section along a second direction crossing the first direction.

12. The semiconductor device of claim 1, further comprising a source/drain sidewall spacer covering a part of the source drain region and made one of SiN, SiON or SiCN.

13. The semiconductor device of claim 12, wherein a part of the first layer is disposed between the second epitaxial layer and the source/drain sidewall spacer.

14. The semiconductor device of claim 1, wherein a top of the channel region is below a top of the third epitaxial layer.

15. The semiconductor device of claim 14, wherein a height H1 from the top of the channel region to the top of the third epitaxial layer is in a range from 5 nm to 10 nm.

16. A semiconductor device, comprising:
a fin structure having a channel region protruding from an isolation insulating layer; and
a source/drain region made of a semiconductor layer and disposed adjacent to the channel region, wherein:
the source/drain region includes a first epitaxial layer and a second epitaxial layer epitaxially formed on the first epitaxial layer,
an As containing layer is formed under the first epitaxial layer, and
a bottom of the first epitaxial layer is located below an upper surface of the isolation insulating layer.

17. The semiconductor device of claim 16, wherein a thickness of the As containing layer is in a range from 0.5 nm to 5 nm.

18. The semiconductor device of claim 16, wherein the first epitaxial layer is a SiP layer.

19. The semiconductor device of claim 16, wherein the second epitaxial layer includes one or more of a SiAs layer, a SiCAs layer and a SiPAs layer.

20. A method of manufacturing a semiconductor device, comprising:
forming a first layer over a source/drain region;
forming a second epitaxial layer over the first layer; and
forming a third epitaxial layer over the second epitaxial layer,
wherein the first layer contains elements having larger atomic mass than elements of the source/drain region, and
the first layer is formed by implanting As ions into the source/drain region.

* * * * *